(12) United States Patent
Chen

(10) Patent No.: US 6,861,677 B2
(45) Date of Patent: Mar. 1, 2005

(54) PACKAGE OF LIGHTEMITTING DIODE WITH PROTECTIVE ELEMENT

(75) Inventor: Tzer-Perng Chen, Hsinchu (TW)

(73) Assignee: United Epitaxy Co., Ltd., Hsinchu (TW)

( * ) Notice: Subject to any disclaimer, the term of this patent is extended or adjusted under 35 U.S.C. 154(b) by 199 days.

(21) Appl. No.: 10/188,847

(22) Filed: Jul. 5, 2002

(65) Prior Publication Data

US 2003/0189201 A1 Oct. 9, 2003

(30) Foreign Application Priority Data

Apr. 3, 2002 (TW) .......................................... 91103964 A

(51) Int. Cl.⁷ .......................................... H01L 31/0203
(52) U.S. Cl. ............................................................. 257/99
(58) Field of Search .............................. 257/76, 79, 81, 257/98, 99, 100; 438/25, 26, 122

(56) References Cited

U.S. PATENT DOCUMENTS

| | | | | |
|---|---|---|---|---|
| 6,084,252 A | * | 7/2000 | Isokawa et al. | 257/98 |
| 6,498,355 B1 | * | 12/2002 | Harrah et al. | 257/99 |
| 6,642,072 B2 | * | 11/2003 | Inoue et al. | 438/26 |
| 6,696,704 B1 | * | 2/2004 | Maeda et al. | 257/98 |
| 6,713,877 B2 | * | 3/2004 | Hirano et al. | 257/778 |
| 2002/0179914 A1 | * | 12/2002 | Sheu | 257/90 |

FOREIGN PATENT DOCUMENTS

JP          11346007 A  * 12/1999  ........... H01L/33/00

* cited by examiner

Primary Examiner—Carl Whitehead, Jr.
Assistant Examiner—Jennifer M. Dolan
(74) Attorney, Agent, or Firm—Troxell Law Office, PLLC

(57) ABSTRACT

A package structure of light-emitting diode with an electrostatic protective diode is disclosed. The structure has a light-emitting diode, an electrostatic protective diode, an electrical & heat conductive pad, and an electrical & heat conductive base substrate. The light-emitting diode is flipped and with its p-electrode and n-electrode, respectively, mounted on the n-electrode of the electrostatic protective diode and the electrical & heat conductive pad by conductive bumps. The latter two are separated themselves by a gap or an insulation layer and both of them are mounted on and electrically connected to the electrical & heat conductive base substrate. The structure is then through a bonding wire bonding to a bonding pad and the electrical & heat conductive base structure, respectively, connected to a positive and a negative terminal of a DC power to implement the electrical connection. The foregoing bonding pad is located on the exposed portion of n-electrode of the electrostatic protective diode.

18 Claims, 5 Drawing Sheets

BACKGROUND OF THE INVENTION

1. Field of the Invention

The present invention pertains to the light-emitting diode, and more particularly to the package of a light-emitting diode with an electrostatic protection element.

2. Description of the Prior Art

Generally, the light-emitting diode has the characteristics of: small volume, lower power consumption, longer life time, short response time, and with excellently monochromatic color. Generally, it is found to be applied in the home appliance, computer and its periphery, and communication products. Since, 1993 Nichia Chemical corp., successfully developed the gallium nitride (GaN), the blue light-emitting diode, which enables the light-emitting diode with fully colors to be realized and thus expands applications thereof to the fully color display, traffic light signal, traffic information panel and instrument panel in car, the braking light, and rear side-marker light. According to the research reports, the high intensity LED such as tour elements AlGaInP LED with wavelength ranges from yellow-green light to red light can reduce the chip number furthermore. The day of using LED instead of tungsten lamp to attain the purpose of lower maintenance and save electricity consumption seems to come approaching.

In general, the GaN blue light emitting diode is grown on the sapphire substrate, which is an insulator. Thus the n-electrode and p-electrode thus are required to be formed on the same side and the chip could not be too small, the size of a chip is typically about 350 μm×350 μm. However, the P/N junction is very close to the surface, and thus is readily destroyed by the electrostatic charges. Particularly, under dry environment, the electrostatic charges are easily accumulated to a level of about 1–2 KV on the human body. Under such situation, if it happens that the man unintentionally touches one of the diode pins, even a minute current may still destroy the light-emitting diode, which is typically operate at the range of 1–4 volt. In particular the blue light or blue-green light-emitting diode has the highest merchandise price among the various light emitting diode because the owners who have the manufacture technique are rare and high price of sapphire substrate. All of the factors support the price of the blue light or blue-green LED to be several folds or even hundred folds of others among three primitive colors. Thus, the package of the blue or blue-green LED associates with electrostatic element is very crucial.

Currently, to prevent the light-emitting diode from the electrostatic discharge, the LED is in parallel with a protective element. FIG. 1 shows a schematic circuit of the light-emitting diode is shunt with a Zener diode 2. The blue light or blue-green light-emitting diode 1 is operated at a voltage of forward biased between about 3–4V The Zener diode 2 is worked reverse biased, typically at a voltage of Zener breakdown, which is about 8V. In normal operation, the operation voltage is lower than Zener breakdown, as a result, no electricity power is consumed from the Zener diode because the off-state. However, in case of high voltage such as 1000V–2000V, accumulated by electrostatic charges is touched on any pin of the LED, will cause the LED device and Zener diode both turn on, however, the current is almost drained through the Zener diode 2, which is in Zener breakdown because of much low impedance In consequent, the light-emitting diode 1 is being protected.

There are several of conventional methods proposed to construct the circuit as shown in FIG. 1. However, each of them though solve some disadvantages present in the prior art but new issues are associated with the newly method. For example, please see FIG. 2, a first embodiment, the package proposed by Inoue et al., in U.S. Pat. No. 6,333,522 may have the best brightness for a single blue light emitting diode as we had known. The Inoue's patent includes twelve embodiments. Most of them include only the minor structure modified on light-emitting diode or silicon diode. An exemplary one in them is shown please see FIG. 2 and FIG. 2A, the bottom of the Zener diode 2 having an n-electrode 9 is positioned on the flat bottom of the cone-shaped reflector 15 through a conductive silver paste layer 14. The reflector 15 designed is in accordance with the reflective angle of light from the light emitting element. Beneath flat bottom of the reflector 15 is a leadframe 13a, which connects to a positive terminal of DC (direct current). The Zener diode 2 includes a p-electrode 7 having a mini-bump 11 thereon, and a bonding pad 10 on the p region 21, which is in the n+ doped substrate 2, as well as an n-electrode 8 having a bump 12 on the n-type substrate 20. In addition, the light-emitting diode 1 having an n-electrode 6 and a p-electrode, respectively, mounted on the bump 11 and 12 so as to form electrical connections with the p-electrode 7 and n-electrode 8 of Zener diode 2. A gold wire 17 is then bonding to the bonding pad 10 of Zener diode 2 and the leadframe of the negative electrode 13b. Finally a transparent resin 18 as package material is then capsulated them to form the light-emitting diode entity.

For blue light LED is concerned, most of them are with the n-electrode 6 and the p-electrode 5 on one side due to the insulation of the sapphire substrate. Of course as the substrate is silicon carbide the n-electrode and the p-electrode may at different sides. For flip-chip as Inoue et al proposed, only one bonding wire 17 is required, the upward surface of the light-emitting surface is free from any bonding pad. As a result, as the light intensity is concerned, it gives most satisfied brightness among all LED packages.

However, to tell about the package process, several issues are found. Since the area of the light-emitting diode chip is about several tens mil square typically, is about 12 mil×12 mil (1 mil is about 1/1000 inch), and the solder is about 30~50 μm in height for a conventional bump process. Thus for a chip is flipped, the difficulty of alignment is drastically increased while the p-electrode 5 of the and n-electrode of the light-emitting diode, respectively, aligned with such miniature bumps 12 and 11 on the n-electrode 8 and the p-electrode 7 of Zener diode It will be detrimental to the mass produce and the yield. Worthwhile increasing the size of the solder bump is not appropriated since it will cause the risk of the circuit in short between the p-electrode 7 and the n-electrode 8. Furthermore, to avoid the silver paste 14 over filled, the Si-base substrate: the Zener diode can not be formed too thin in thickness. Typically the thickness is about 1500 μm~200 μm. Still, the heat dissipation can only slowly dissipate through the light-emitting diode itself and part of them from the silicon diode. Therefore the package techniques provided by Inoue still have room to improve.

For the silicon diode manufacture technique is concerned, the p-region 21 formed in the n substrate 20 is through lithographic and doping processes. It will increase fabrication cost compared with those Zener diode, which has p-electrode and n-electrode on the different sides.

Please refer to FIG. 3, the second embodiment of conventional technique issued to Sonobe et al in U.S. Pat. No. 6,054,716. By contrast to first embodiment, the chip of the light-emitting diode and the chip Zener diode 55 are positioned at different heights. One is on the bottom 61 of the reflector, atop the leadframe of positive electrode 52a, the other one is on the flange 62 of the reflector. In the second embodiment the Zener diode 55 has a p-electrode and an n-electrode on different sides. The n-electrode 55a of the silicon Zener diode is mounted on the flange 62 of the reflector through the silver paste 58. The p-electrode 55b of Zener diode 55 is then through conductive wire 68 connects to the leadframe of the negative electrode 52b. The p-electrode 65 of the light-emitting diode 53 is then connected to the leadframe of positive electrode 52a through a wire 66. The n-electrode 63 of the light-emitting diode 53 connected to the p-electrode 55b of the Zener diode 55 through a wire 67. Finally, the light-emitting diode 53 and Zener diode 55 and the reflector 61 along with the wires 66, 67 and 68 are molded with a transparent resin 73.

In the second embodiment, it require three wires (means two pads 65, 63 on the LED, and one on the Zener diode 55), the light intensity is thus weaker than the flip-chip type, which has one bonding wire on the Zener diode 1 merely. However, the yield and mass producing can be attained significantly improvement. Although the benefits as depicted above, some fatal problems are associated with the structure of the second embodiment: (1) the position height of the flange 62 and the bottom 61 of the reflector are different, and both of them are required to have a silver paste layer welded, and thus the welding stud machine would be much expensive than those for just one point stud. Furthermore, the area of the flange 62 is far less than the area of the bottom 61 of the reflector, As a result, the difficulty for pasting the silver paste thereon. In summary, it's still required to improve.

Please refer to FIG. 4 of a schematic diagram of the third embodiment according to the prior art. The present embodiment is in accordance with the U.S. Pat. No. 6,084,252 disclosed by Isokawa. A Zener diode 105 has an n-electrode (not shown) formed at its bottom face welded on a lateral position of a positive electrode of the leadframe 107a with a silver paste layer. A p-electrode formed at a top face of the Zener diode 105 electrically connects to a lateral surface of a negative electrode of the leadframe 107b via conductive wire 104. A LED 103 mounted on a recess portion of a cone-shaped reflector 101 has a p-electrode 111 and an n-electrode 113. The p-electrode 111 and the n-electrode 113 respectively connect to the positive electrode of the leadframe 107a and to the negative electrode of the leadframe 107b of the reflector via conductive wires 108, 109. Finally, the respective tip portion of the leadframes 107a and 107B and the above element 103, are molded with transparent resin 116 to form a dome-shaped LED structure.

The package structure of the third embodiment can solve the problems of about misaligning the Zener diode 10 with the LED 20 according to the first embodiment, and can also solve the problems of silver paste welding difficulty on the flange 62 of the cone-shaped reflector according to the second embodiment. However, for practical welding process is concerned, to weld the silver paste layer stud on a predetermined position of to the lateral position of a leadframe 107a by robot arms would at least have to turn leadframe or turn robot arm by 90° with respect to the upright position. Therefore, it's unpractical technique unless the silver paste-welding machine is re-designed or re-equipped.

An object of the present invention is thus proposed a package design to raise the process yield as well as mass producing the light-emitting diode with an electrostatic protection device.

SUMMARY OF THE INVENTION

A package structure of light-emitting diode with an electrostatic protective diode is disclosed. The package structure comprises a light-emitting diode, an electrostatic protective diode, an electrical & heat conductive pad, and an electrical & heat conductive base substrate. In the first preferred embodiment, the light-emitting diode is flipped and with its p-electrode and n-electrode, respectively, mounted on the n-electrode of the electrostatic protective diode and the electrical & heat conductive pad by conductive bumps. The latter two are separated themselves by a gap or an insulation layer and both of them are mounted on and electrically connected to the electrical & heat conductive base substrate. The structure is then through a bonding wire bonding to a bonding pad and the electrical & heat conductive base substrate, respectively, connected to a positive and a negative terminal of a DC power to implement the electrical connection. Forgoing bonding pad is located on the exposed portion of n-electrode of the electrostatic protective diode.

In the second preferred embodiment, the package structure is the same members as the first preferred embodiment. However the positions of the electrostatic protective diode and the electrical & heat conductive pad are swapped and also the electrodes of the electrostatic protective diode are turned over. That is the electrical & heat conductive pad connected to the p-electrode of the light-emitting diode, which is flipped and the p-electrode of the electrostatic protective diode come into contact with the n-electrode of the light-emitting diode by a conductive bump.

As a result, the bonding pad for a wire is formed on the p-electrode of the electrostatic protective diode. The n-electrode and the p-electrode of the LED respectively, mounted on the p-electrode of the electrostatic protective diode and the electrical & heat conductive pad by conductive bumps. The latter two are separated themselves by a gap or an insulation layer and both of them are mounted on and electrically connected to the electrical & heat conductive base substrate. The structure is then through a bonding wire bonding to a bonding pad and the electrical & heat conductive base substrate, respectively, connected to a negative and a positive terminal of a DC power to implement the electrical connection. Forgoing bonding pad is located on the exposed portion of p-electrode of the electrostatic protective diode while the LED is overlapped to the silicon Zener diode and the electrical & heat conductive pad.

In the present invention, the electrostatic protective diode and the electrical & heat conductive pad can have a thickness thinner than 100 μm, and even lower than 50 μm Thus the heat generated from the LED can be dissipated rapidly and injected into the electrical & heat conductive base substrate: the copper base substrate or the aluminum base substrate. Consequently the LED can be operated at a higher power than conventional one to increase the light intensity.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As forgoing prior art depicted for the light-emitting diode with protective diode, while a new package structure is proposed to solve the issues of the prior art thereof, however, a new problem is often generated accompanying with the newly proposed method. Although light intensity of the flip-chip package for the light-emitting diode with the p-electrode and the n-electrode on the same side is the best among all because it without the light degraded by the shielding of the electrode, it has the problem of alignment for Zener diode and the LED each other and thus it is not suitable to mass produce In addition, the manufacture cost of Zener diode of p-electrode and the n-electrode on the one side is higher than those of on the two side. For examples, the package method as depicted in the second, the third, or the fourth preferred embodiment of the background of the invention, which are without the alignment problem and thus the yield anticipated to be increased, however, they generally required either to update the apparatus or complicate the package processes. Moreover, the light degrade is their common disadvantage.

Figure 1:
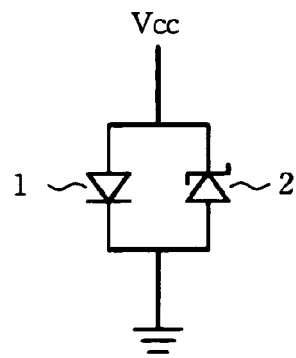
FIG. 1 is a schematic equivalent circuit of a LED in parallel connection with an electrostatic protective diode, the former one is of forward-biased and the latter is of a reverse-biased.
Figure 2A:
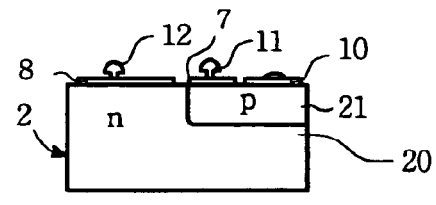
FIG. 2 is a schematic diagram of the first embodiment according to the prior art; a LED positioned in a flip-chip configuration aligns with a Zener diode to form a LED structure with an electrostatic protective function.
Figure 2:
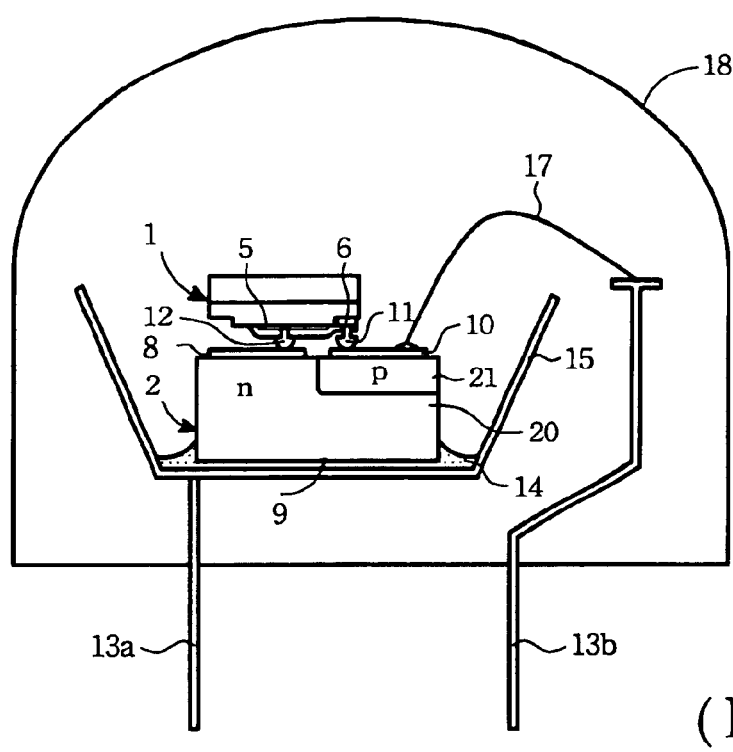
Figure 3:
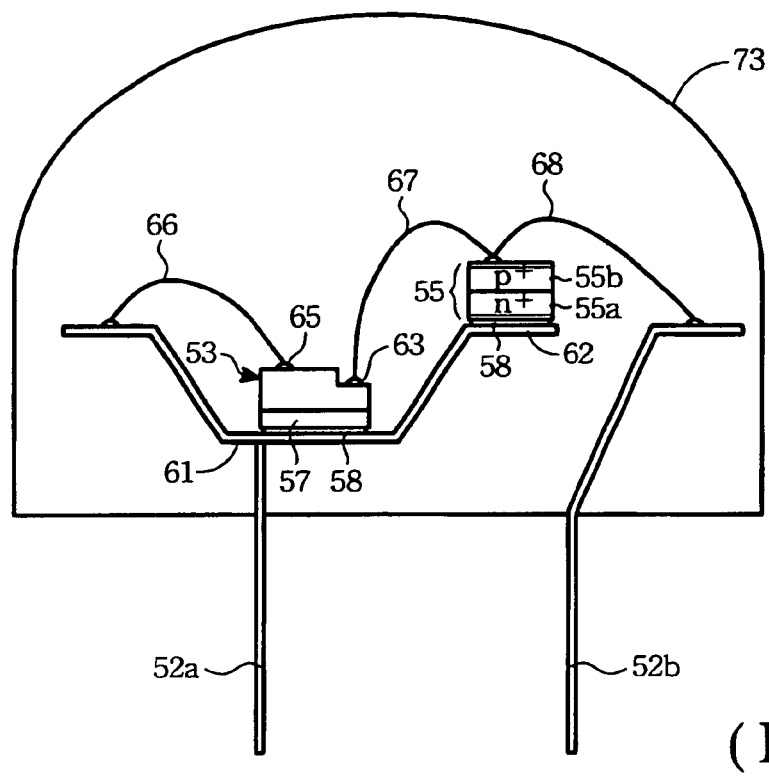
FIG. 3 is a schematic diagram of the second embodiment according to the prior art, a LED and a Zener diode mounted on different position of a lampstand so as to form a LED structure with an electrostatic protective function.
Figure 4:
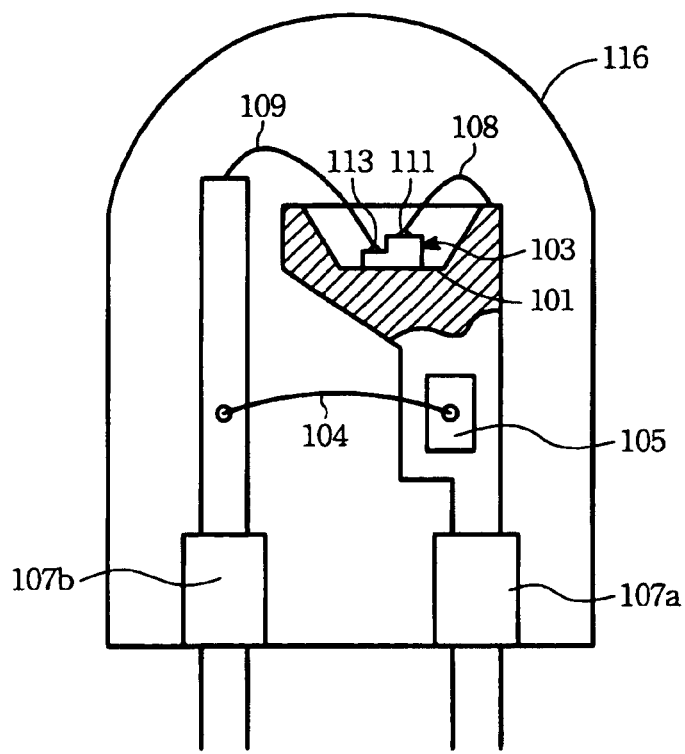
FIG. 4 is a schematic diagram of the third embodiment according to the prior art, a LED mounted on a bottom face of a lampstand and a Zener diode mounted on the lateral position of a positive electrode of the leadfranme so as to form a LED structure with an electrostatic protective function.
Figure 5:
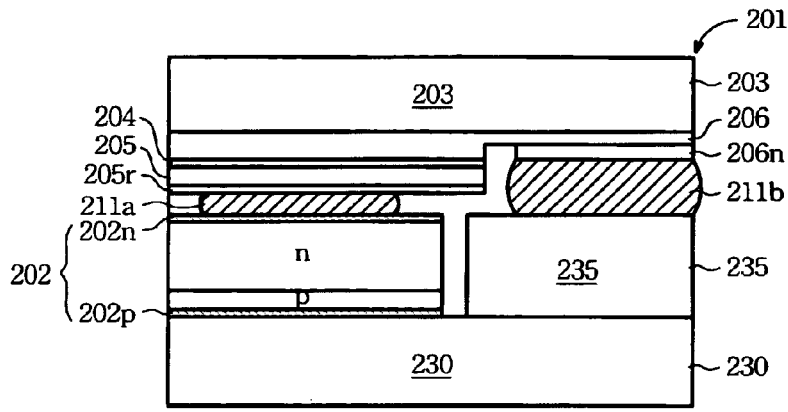
FIG. 5 the LED is flipped and with its p-electrode and n-electrode, respectively, mounted on the n-electrode of the electrostatic protective diode and the electrical & heat conductive pad, the latter two then mounted on the electrical & heat conductive base substrate.

The present invention is thus provided a novel package structure for the light-emitting diode. In package structure, the LED chip is flipped. None of any light emerged from the upper surface is required to sacrifice. At the meantime, the p-electrode and the n-electrode is respectively, positioned on the different side of the Zener diode or other protective diode or electrostatic protection device, would reduce the manufacture cost. Furthermore, in the preferred embodiment according to the present invention, an electrical conductive heat dissipation base substrate with heat dissipation capability better than silicon is provided for supporting the light emitting diode, and thus the light-emitting diode can be allowed to operate at higher power to increase the light intensity The package structure is composed of a light-emitting diode 201 having an n-electrode and a p-electrode on the same side, a Zener diode 202, or other electrostatic protective diode, an electrical & heat conductive base substrate 230 and an electrical & heat conductive pad 235 according to the present invention, as is shown in FIG. 5. The Zener diode 202 is formed with an n-electrode and a p-electrode on the other side. The electrical connections are such that the p-electrode 205r and n-electrode 206 of the light-emitting diode 201 are connected to the n-electrode 202n of the silicon diode 202 and the electrical & heat conductive pad 235 by means of a solder layer or a conductive bump 211a and conductive bump 211b, respectively. The Zener diode 202 and the electrical & heat conductive pad 235 are mounted on the electrical & heat conductive base substrate 230 by using solder layer.

Still referring to FIG. 5, a cross-sectional view of the light-emitting diode is shown. The GaN base light-emitting diode 201 consisting of a transparent substrate 203 such as a sapphire substrate or a silicon carbide(SiC) substrate, which does not absorb or little absorb the light generated from the light emitting layer (or say the active layer 204).

The GaN base light-emitting diode 201 comprises, from a bottom thereof, the transparent substrate 203, an n-type GaN layer 206, an InGaN/GaN multi-quantum well structure 204, a p-type GaN layer 205 and a metal reflector 205r. The GaN base light-emitting diode 201 is etched by a lithographic and a etch technique to expose a portion of n-type GaN layer 206 and then an n-type ohmic-contact electrode 206n is formed on the exposed n-type GaN layer 206. Aforementioned GaN light-emitting diode 201 is to illustrate the n-electrode and the p-electrode at the same side, and the type of the LED is not limit thereto. The present invention is suitable to other LED such as AlGaInP LED too if the LED is demanded with n-electrode and the p-electrode on one side.

Figure 6:
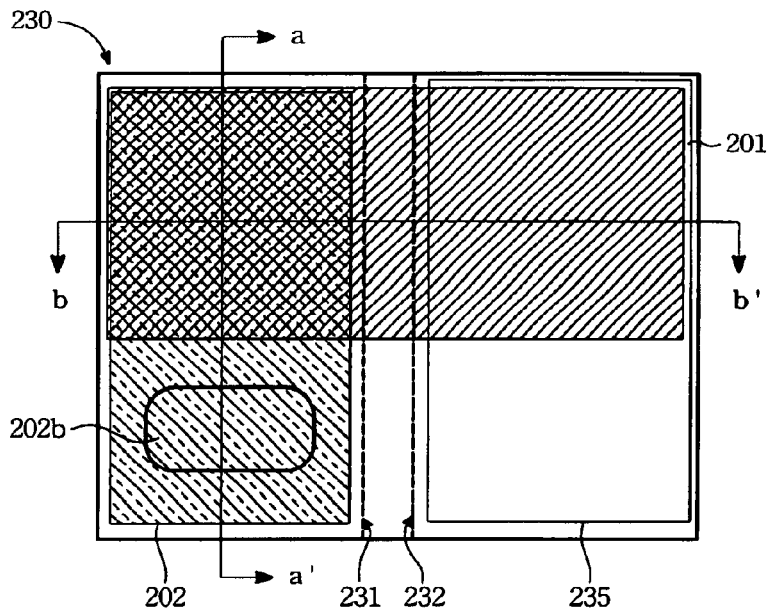
FIG. 6 is a top view of the electrical & heat conductive base substrate t according to the present invention: the first portion is for supporting the silicon diode and the second portion is for supporting electrical & heat conductive pad, wherein a top surface of the silicon diode having an exposed region for forming a bonding pad.

Referring to FIG. 6, shows the top view of the electrical & heat conductive base substrate 230 in according to the present invention. To provide function of heat dissipation, the electrical & heat conductive base substrate 230 can be selected from the material such as aluminum, copper, silicon carbide or the like which has excellently electrical and heat conductivity. The planar surface of the conductive base substrate 230 can be viewed from two portions: the first portion 231 is for setting silicon Zener diode 202 up and the second portion 232 for mounting the electrical & heat conductive pad 235. The electrical & heat conductive pad 235 is chosen from silicon semiconductor such as the material the same as the silicon Zener diode 202, or a silicon carbide. The gap between the silicon diode 202 and electrical & heat conductive pad 235 can optionally have an insulator layer such as resin in between. It is noted that a portion 202b of silicon Zener diode 201 is still exposed while the light-emitting diode 201 is overlapped on the silicon diode 201 and the electrical & heat conductive pad 235. The region 202b is reserved to form a bonding pad thereon so as to bonding a wire 217, thereto connect to a metal post 213p of the leadframe, a positive electrode.

Figure 8A:
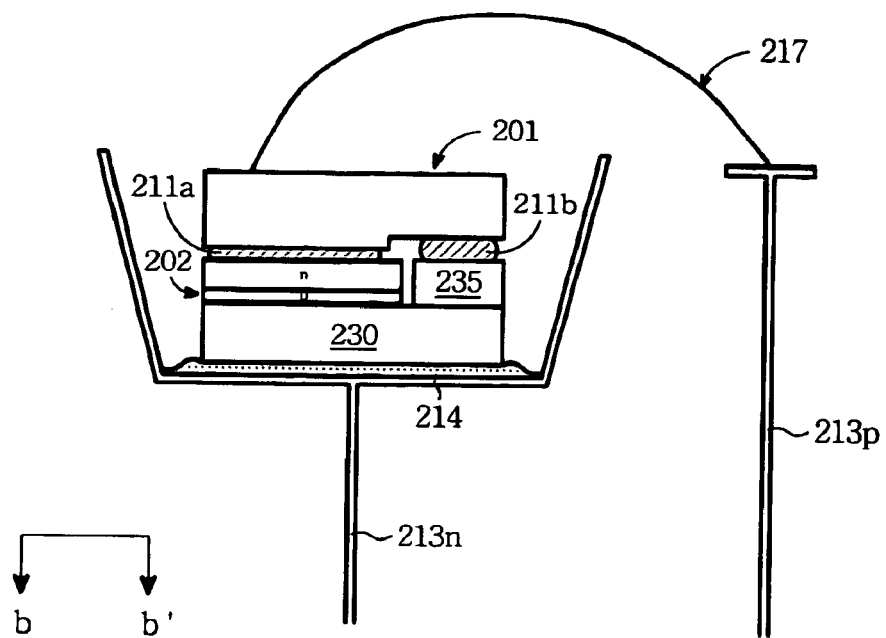
FIGS. 8a & b respectively, show the front view and said view of the package structure housed in the lampstand according to the present invention.
Figure 8B:
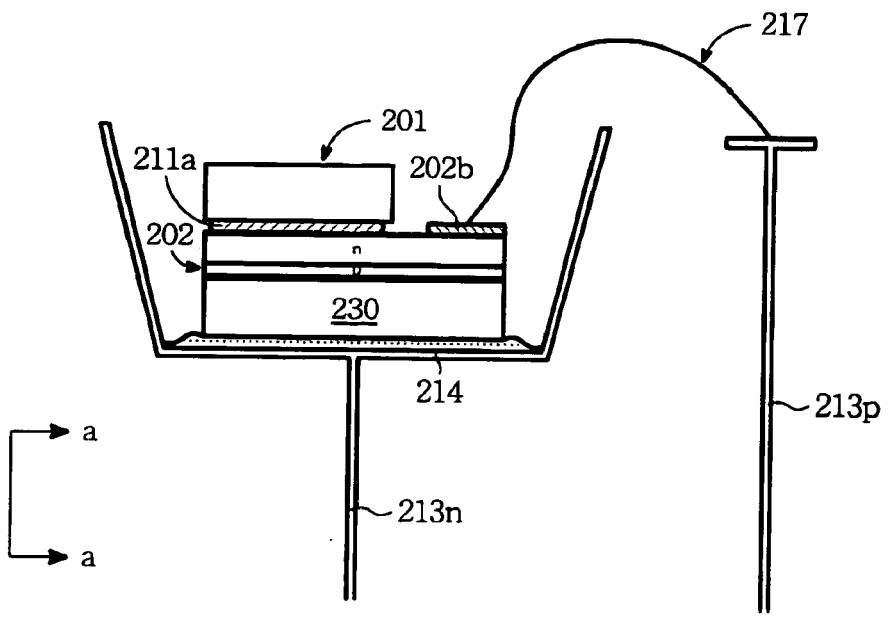

Please refer to FIGS. 8A and 8B, which are sideviews along the line b–b' and a–a', respectively. The conductive base substrate 230 is mounted on a recessed portion 213n of the leadframe, the negative electrode, by a silver paste layer.

Figure 7:
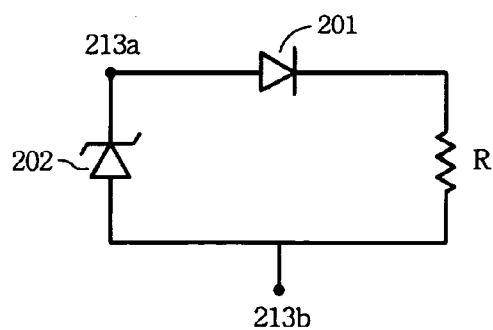
FIG. 7 shows an equivalent circuit according the package structure of FIG. 5.

Of above mentioned electrical connections is equivalent to an equivalent circuit, as is shown in FIG. 7. The electrical & heat conductive pad 235 is equivalent to a resistor R in FIG. 7.

To enhance the heat dissipation capability of the package structure, thinner silicon Zener diode 202 and the electrical & heat conductive pad 235 are preferred. Thinner of them will provide a shorter route between the LED 201 and electrical & heat conductive base substrate 230 so that the heat generated from the light-emitting diode can rapidly dissipate and thus allow increase the power of the light-emitting diode 201. Therefore, the thickness of Si Zener diode should be less than 100 µm. The preferred thickness of the SiZener diode is 50 µm or less.

Figure 9:
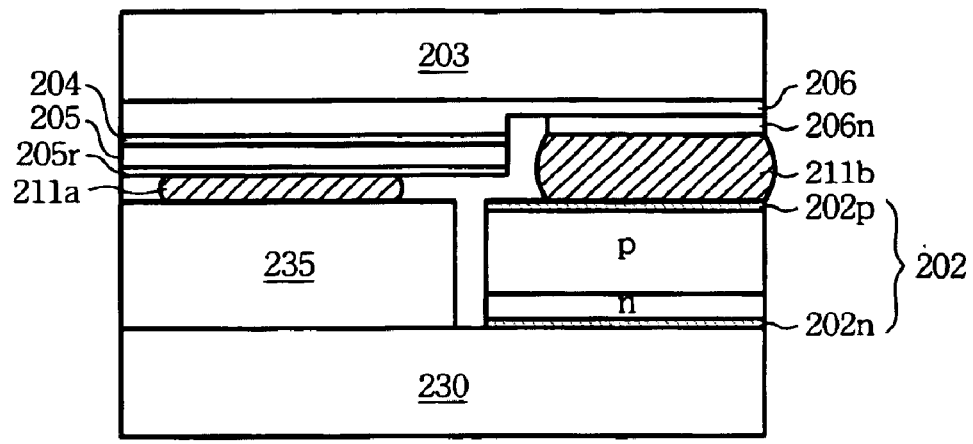
FIG. 9 shows a cross-sectional view of the package structure according to the present invention.
Figure 10:
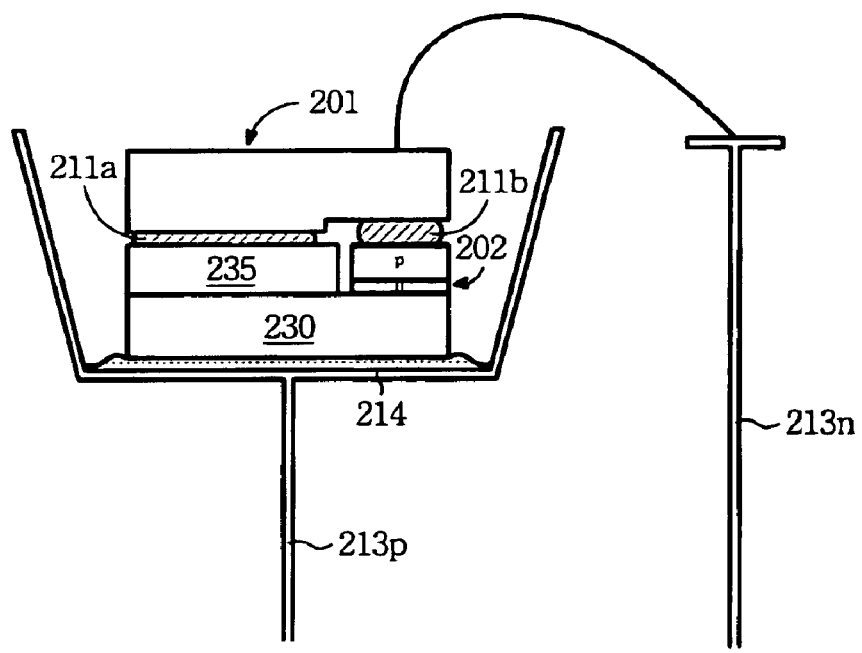
FIG. 10 shows a package structure housed in the lampstand according the second embodiment of the present invention.

The first preferred embodiment make the n-electrode 202n of the silicon diode 202 aligned with the p-electrode 205r of the flipped LED 201 and the electrical & heat conductive pad 235 aligned with the n-electrode 206 of the light-emitting diode. Then the electrical & heat conductive pad 235 and the silicon Zener diode 202 mounted on the first portion 231 and the second portion 232 of the electrical & heat conductive base substrate 230. The package can also be modified as follows, for example, the positions of the electrostatic protective diode and the electrical & heat conductive pad are swapped and also the n and the p-electrode of the electrostatic protective diode are turn over, a result of cross-sectional view is shown in FIG. 9 and the package structure positioned in a recess portion of the reflector is shown in FIG. 10. In that, the bonding pad is on the p-electrode 202p instead of the n-electrode 202n.

The benefits of the present invention:

The package is by a way that the light-emitting diode is flipped and thus the light-emitting diode itself without any bonding pad on the upward surface as consequently, no light detraction is occurred The p and n-electrode of the Zener diode is on different side, and thus can simplify the package process.

The present invention provides an easy package and high yield. Since the package process without worry the occurrence of short circuit between the n-electrode and the p-electrode due to large bump, and thus easier to align the flipped LED with the silicon diode and the electrical & heat conductive pad.

The heat dissipation capability is higher than the conventional one due to the thinner silicon Zener diode. In the conventional flip-chip LED on the zener silicon diode package, the silicon Zener diode should have a thickness higher than 200 µm to prevent short circuit due to overflow of the silver paste. In the present invention, the heat generated from the LED can be dissipated through thinner Zener diode and into the electrical & heat conductive base substrate: the copper base substrate or the aluminum base substrate Consequently the LED can be applied at a higher power than conventional one to increase the light intensity.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure. For examples, the prime examples of the light-emitting diode and electro-static protective diode are package in the housing space of the reflector. The package can have multiple LED dies package together or without the reflector as above.

What is claimed is:

1. A structure of a light-emitting diode with a protective diode, said structure comprising:

an electrical & heat conductive base structure electrically connected to a negative terminal of DC power source;

an electrical & heat conductive silicon pad mounted on and electrically connected to a second portion of said electrical & heat conductive base substrate;

an electrostatic protection diode separated from said electrical & heat conductive pad by a gap and having a p-electrode and an n-electrode, respectively, formed on a bottom and a too surface, and said p-electrode mounted on and electrically connected to a first portion of said electrical & heat conductive base substrate;

a light-emitting diode, having a p-electrode and an n-electrode formed on a same side, respectively, mounted on and electrically connected to said n-electrode of said electrostatic protective diode and said electrical & heat conductive pad, wherein a portion of said n-electrode of said electrostatic protective diode is exposed for forming a bonding pad; and a conductive wire bonded to said bonding pad and to a positive terminal of said DC power source.

2. The structure according to claim 1, further comprising a leadframe having a recess portion for housing said electrical & heat conductive base substrate thereto connect said negative terminal and said leadframe having a metal post portion thereto connect said positive terminal.

3. The structure according to claim 1, said mounted on and electrically connected is in terms of conductive bumps or a metal bonding layer or conductive solder balls.

4. The structure according to claim 1, wherein said electrical & heat conductive pad is separated from said electrostatic protective diode by a insulating material gap, and both electrical & heat conductive pad and said electrostatic protective diode mounted on said electrical & heat conductive base substrate through a metal bonding layer or a silver plate layer.

5. The structure according to claim 1, wherein said electrostatic protective diode is a Zener diode.

6. The structure according to claim 1, wherein said light-emitting diode is a blue or a blue-green LED or an AlGaPIn LED, which has a metal reflective layer formed at a p-electrode.

7. The structure according to claim 1, wherein said electrical & heat conductive base substrate is selected from copper, aluminum or silicon carbide.

8. The structure according to claim 1, wherein said electrostatic protective diode has a thickness smaller than 100 µm.

9. The structure according to claim 1, wherein said electrostatic protective diode has a thickness smaller than 50 µm.

10. A structure of a light-emitting diode with a protective diode, said structure comprising:

an electrical & heat conductive base substrate electrically connected to a positive terminal of DC power source;

an electrical & heat conductive silicon pad mounted on and electrically connected to a first portion of said electrical & heat conductive base substrate;

an electrostatic protection diode separated from said electrical & heat conductive pad by a gap and having an n-electrode and a p-electrode, respectively, formed on a bottom and a top surface, and said n-electrode mounted on and electrically connected to a second portion of said electrical & heat conductive base substrate;

a light-emitting diode, having a n-electrode and an p-electrode formed on the same side, respectively, mounted on and electrically connected to said p-electrode of said electrostatic protective diode and said electrical & heat conductive pad, while a portion of said p-electrode of said electrostatic protective diode is exposed for forming a bonding pad; and a conductive wire bonded to said bonging pad and to a negative terminal of said DC power source.

11. The structure according to claim 10, further comprising a leadframe having a recess portion for housing said electrical & heat conductive base substrate thereto connect said positive terminal and said leadframe having a metal post thereto connect said negative terminal.

12. The structure according to claim 10, wherein said mounted on and electrically connected is in terms of conductive bumps or a metal bonding layer or conductive solder balls.

13. The structure according to claim 10, wherein said electrical & heat conductive pad is separated from said electrostatic protective diode by a insulating material gap, and both electrical & heat conductive pad and said electrostatic protective diode are mounted on said electrical & heat conductive base substrate through a metal bonding layer or a silver paste layer.

14. The structure according to claim 10, wherein said electrostatic protective diode is a Zener diode.

15. The structure according to claim 10, wherein said light-emitting diode is a blue or a blue-green LED or an AlGaPIn LED, which has a metal reflective layer form at a p-electrode.

16. The structure according to claim 10, wherein said electrical & heat conductive base substrate is selected from copper, aluminum or silicon carbide.

17. The structure according to claim 10, wherein said electrostatic protective diode has a thickness smaller than 100 $\mu$m.

18. The structure according to claim 10, wherein said electrostatic protective diode has a thickness smaller than 50 $\mu$m.

* * * * *